Jan. 23, 1968 W. TOUCHY ETAL 3,365,553

PRESSURE-RESPONSIVE TRANSISTOR

Filed Sept. 11, 1964 3 Sheets-Sheet 1

Jan. 23, 1968 W. TOUCHY ET AL 3,365,553

PRESSURE-RESPONSIVE TRANSISTOR

Filed Sept. 11, 1964 3 Sheets-Sheet 3

United States Patent Office 3,365,553

Patented Jan. 23, 1968

3,365,553

PRESSURE-RESPONSIVE TRANSISTOR

Wolfgang Touchy and Hans-Norbert Toussaint, Munich, and Friedrich Krieger, Gilching, Germany, assignors to Siemens Aktiengesellschaft, a corporation of Germany Filed Sept. 11, 1964, Ser. No. 395,691
Claims priority, application Germany, Sept. 13, 1963, S 87,293; Sept. 30, 1963, S 87,673
4 Claims. (Cl. 179—110)

ABSTRACT OF THE DISCLOSURE

Current supply leads are attached only to the outer two regions of a semiconductor body having three sequential regions of alternatively opposite conductance types which form a p-n junction between each two of the regions. A pressure device mechanically engages the semiconductor body at one of the p-n junctions and the immediate vicinity thereof and at the other of the p-n junctions and the immediate vicinity thereof under a biasing pressure sufficient to render the semiconductor body conductive. A pressure variation is imposed on the pressure device and the semiconductor body responds to such pressure variation.

Our invention relates to pressure-responsive semiconductor devices. More particularly, our invention relates to pressure-responsive semiconductor devices having three sequential regions of respectively different conductance type which form p-n junctions between adjacent regions and act as emitter, base and collector, respectively; one of the p-n junctions or its vicinity being subjected to variable mechanical pressure by means of a pressure point.

Devices of this general type are known, for example, as described in the paper, "Highly Sensitive Microphone Uses Transistor as Base," in Bell Telephone Laboratories Record, December 1962, pages 418 and 419.

Generally, the pressure sensitivity of p-n junction semiconductor devices is particaulrly high if the pressure transmitting point is placed against or abuts a p-n junction or in the immediate vicinity thereof. When a transistor is utilized, the point may be attached to a surface locality at the emitter-base junction or on the surface of the emitter region. Pressure variations transmitted by the point upon the transistor then result in corresponding variations of the collector current, provided the base of the transistor is supplied with a corresponding base current. Electrically, therefore, such a device is a tripole or a triode.

There are many purposes, however, for which the use of a triode is undesirable. This is the case, for example, with various microphones, phonograph pickups and other devices where the provision of a third lead is inconvenient or disadvantageous. It is an object of our invention, therefore, to provide a semiconductor with a pressure-responsive semiconductor device which electrically constitutes a true dipole or diode but is controllable in response to pressure variations by means of a pressure point in substantially the same manner as known semiconductor transistors or similar triodes.

According to the invention, the transistor type semiconductor device is provided with only two electrodes, namely the emitter electrode and the collector electrode, and has a pressure transmitting point in engagement with the semiconductor surface at the collector-base junction or in the immediate vicinity thereof. Since a base current cannot be supplied from the outside because a base electrode is missing, the effect of such base current is replaced by the pressure applied by the pressure point.

We have discovered that such a pressure point, acting upon the collector-base junction, enables the flow of collector current and also enables the control of such collector current without supplying the transistor with base current from an independent source. We have further observed that the collector current varies in dependence upon variations in pressure exerted by the point upon the emitter region; the collector current decreasing with increasing pressure. This also permits the controlling of the collector current.

In a device having the pressure point seated upon the emitter region, the emission from the emitter into the adjacent base region is secured by applying between the collector and emitter regions a voltage, prior to applying the pressure, and making the applied voltage so large that it causes emission of the charge carriers. That is, the collector current of the device is measured in dependence upon the applied voltage, when the collector reverse current $I_{CO}$, is larger than the bucking current $I_{SP}$. This condition is particularly well attained if the recombination in the base region is slight and if the space charge zones formed between collector region and emitter region have approached each other but do not yet touch each other. Under these conditions, the voltage needed for proper operation is adjusted. The collector current may then be controlled by variable pressure of the point.

Reinvestigation of the pressure sensitivity in such devices has shown that the pressure sensitivity also depends upon the collector current. The steep edge of the collector current decline, which corresponds to the range of high sensitivity to pressure variations, is displaced, as a rule, toward higher pressure values with increasing collector current. Since the steepest localities of the curve correspond to the range of higher pressure sensitivity, the electrical working point suitable for measuring or utilizing pressure variations may be adjusted in dependence upon the collector current by applying a pre-pressure upon the semiconductor. It is therefore preferable, according to another feature of our invention, to adjust the working point of the pressure sensitive semiconductor device, depending upon the collector current, by applying a pre-pressure upon the point seated upon the emitter region, and to superimpose upon this biasing pre-pressure the variable pressure to be responded to. This permits the achieving of the result that even with very small variable pressures, a change in pressure will occur only in a range of the operating characteristic in which the device exhibits a high pressure sensitivity by virtue of the steep decline in collector current.

The steepness at which the collector current declines also depends upon the distance of the emitter-base p-n junction from the surface upon which the pressure is exerted. The collector current decline is steeper, the smaller this distance from the surface. A decline of the collector current is also influenced in the same sense by the distance of the collector-base junction from the semiconductor surface. Consequently, the biasing pre-pressure must be adjusted, depending upon the magnitude of these values. The best suitable biasing pressure is preferably determined by testing.

According to another feature of our invention, therefore, the distance of the emitter-base p-n junction from the semiconductor surface upon which the pressure is exerted, is made less than 0.5 micron. However, the distance must always be greater than the mean free path of the charge carriers, because otherwise no emission from the emitter region to the adjacent base region can occur.

A suitable semiconductor material is silicon, germanium or other semiconductor material, such as $A_{III}B_{V}$ semiconductor compounds, for example.

It will be understood from the foregoing that the transistor according to the invention may be connected as a genuine diode into an electrical circuit for producing therein current variations corresponding to the pressure variations acting upon the pressure point.

The aforementioned and other objects, advantages and features of our invention, said features being set forth with particularity in the claims annexed hereto, will be apparent from the following description of the devices embodying the invention by way of example, illustrated in the accompanying drawings, wherein:

Figure 1:
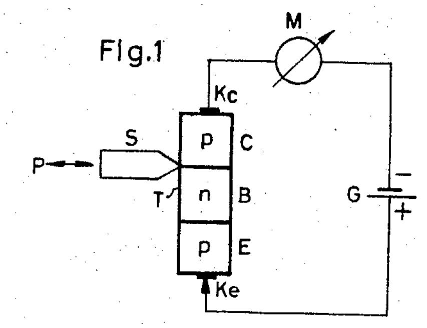
FIG. 1 is a schematic diagram of an embodiment of a pressure-responsive transistor type device of the present invention connected in a measuring circuit.

The semiconductor body of the semiconductor device schematically shown in FIG. 1 has three regions comprising a collector region C of p conductivity type, a base region B of n conductivity type and an emitter region E of p conductivity type. A hard pressure point S abuts against the surface at the locality where the p-n junction between the collector region C and the base region B emerges. The pressure point S comprises, for example, sapphire, and exerts at the selected abutting locality a higher or lower pressure upon the semiconductor in the direction of the double-headed arrow P.

The collector and emitter zones are provided with respective electrodes K*c* and K*e* by means of which the transistor type semiconductor member T is connected in an electric circuit which comprises a current source G and a measuring instrument M. When the pressure upon the point S varies and thereby varies the pressure exerted by said point upon the semiconductor body, a correspondingly varying collector current flows from the collector electrode K*c* to the emitter electrode K*e*. As shown, the transistor T possesses only the two electrodes mentioned. The transistor T therefore has the effect of a resistance connected in the electric circuit and having a resistance value which varies in accordance with the pressure applied by the point S.

Figure 2:
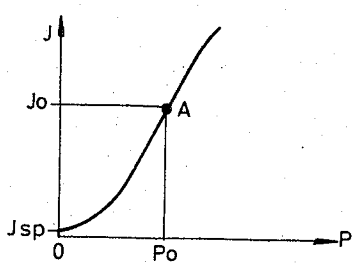
FIG. 2 is an explanatory graph relating to the operation of the device of FIG. 1.

The graph shown in FIG. 2 illustrates the characteristic of a typical performance of the device of FIG. 1. The abscissa indicates the pressure P acting upon the point S and applied by the point S to the semiconductor body. The ordinate indicates the current J indicated by the measuring instrument M. When the pressure P is zero, the current flowing through the transistor constitutes the blocking current $J_{sp}$. This value of current magnitude corresponds to the same current as would pass through the transistor T if it had a normal design with a base electrode, but if no current were supplied to the base electrode.

When a finite pressure P acts upon the point S and is applied by said point to the semiconductor body, the increasing pressure results in an increase of the current J along the curve shown in FIG. 2. If the pressure variations acting upon the point S are to be translated into corresponding current variations, then a biasing pressure P*o* is applied to the point S. whereby the working point A is adjusted on the illustrated characteristic. At this point, the transistor conducts the idling current J*o*.

When the aforementioned pressure variations are superimposed on the constant pre-pressure P*o*, the current variations vary about the idle current value J*o*. That is, the circuit is traversed by a direct current corresponding to the idling current J*o*, and also by an alternating current component which is superimposed upon the direct current.

Depending upon the desired operating conditions, the working point A may be so selected that it is located, for example, in the middle of a largely linear portion of the characteristic. In this case there exists an essentially linear relation between the pressure variations and the resulting current variations. On the other hand, it is also possible to select for the working point a particular steep portion of the characteristic in cases where it is desired to translate only slight pressure increases into the largest possible current increases. In each case, the pre-pressure P*o* and the pressure to be superimposed upon the pre-pressure, should not exceed a value at which the transistor becomes elastically deformed.

Figure 3:
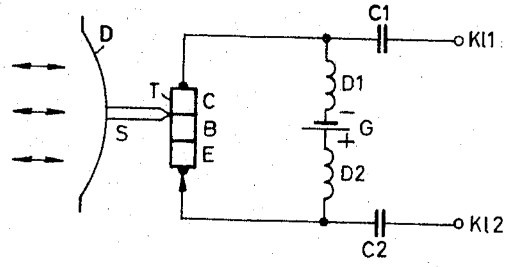
FIG. 3 is a schematic diagram of an embodiment of a microphone type transducer of the present invention.

FIG. 3 illustrates a suitable manner of embodying the invention in an acousto-electric transducer such as, for example, a microphone or a phonograph pickup. According to FIG. 3, the transistor T, having a collector region C, a base region B, and an emitter region E, is employed as a two pole transducer which converts pressure variations generated by sound waves into corresponding variations of an electric current. The sound causes vibration of the diaphragm D to which the pressure point S is directly connected.

The point S is seated upon and abuts the p-n junction between the collector region C and the base region B under an adjusted pre-pressure and thus normally causes the flow of an adjusted direct current through the transistor T, upon which direct current the sound-responsive alternating current variations are superimposed.

The direct current is provided by a battery G through two choke coils D1 and D2, and the direct current is separated from the output terminals K11 and K12 by respective capacitors C1 and C2, which block the flow of direct current from the terminals of the transistor and permit only the alternating current component to pass to the output terminals. This circuit is applicable, for example, in telephone stations to which the direct current is supplied from the central battery of the exchange. The normally flowing direct current and the alternating current are then separated in the exchange by suitable filter means. The transducer comprising the transistor T and the diaphragm D with the pressure point S can readily be given sufficiently small dimensions to accommodate the transducer in the housing correspoonding to that of the conventional microphone capsules.

The effect of the pressure point acting upon the collector-base junction may be further augmented by also providing a pressure point at the emitter-base junction. Such a device may be operated in two different ways. One way is to indicate or respond to a difference or sum value of two pressure magnitudes supplied in the form of respective mechanical pressures to the two points. A second way is to control the two pressure points by only one pressure magnitude in such a manner that the one pressure magnitude increases the pressure acting upon one pressure point while simultaneously reducing the pressure acting upon the other pressure point.

Figure 4:
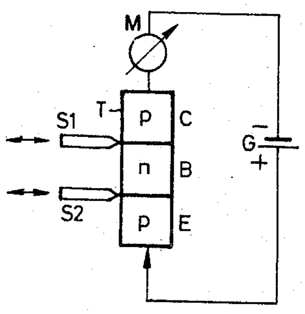
FIG. 4 is a schematic diagram of another embodiment of the device of FIG. 1 including two pressure points at the two p-n junctions of the semiconductor body.

FIG. 4 schematically illustrates the principle of a device including two pressure points. A first pressure point S1 abuts against the collector-base junction and a second pressure point S2 abuts against the emitter-base junction of the transistor T. The current flowing through the transistor T is provided by a battery G and is measured by a measuring instrument M.

If the difference of two pressures is to be measured, the two pressures are directly applied to the two points S1 and S2, respectively. The pressure upon the point S1 and thus exerted by the pressure point S1 upon the collector-base junction of the semiconductor body then results in a tendency toward increasing the current (see FIG. 2), whereas the pressure upon the emitter-base junction of the semiconductor body exerted by the pressure point S2 results in the opposite tendency, thus producing a transistor current flow having a magnitude which is a measure of the difference between the two active pressures.

The device of FIG. 4 also enables the measuring of the sum value of two pressure magnitudes by having one of the pressures act in a pressure reducing sense. If two pressures are involved, for example, one pressure is imposed directly upon one of the pressure points and the other pressure is applied so that it has a pressure reducing effect upon a pre-pressure adjusted at the other pressure point. If, under these conditions, the direct pressure is applied to the pressure point S1, then it results in a tendency toward increasing the current flow through the transistor. However, if the pressure reduction acts upon the pressure point S2, such reduction also involves at such locality a tendency toward increasing the flow of current. As a total result therefore, a current flow will occur whose magnitude corresponds to the sum of the two pressures.

Figure 5:
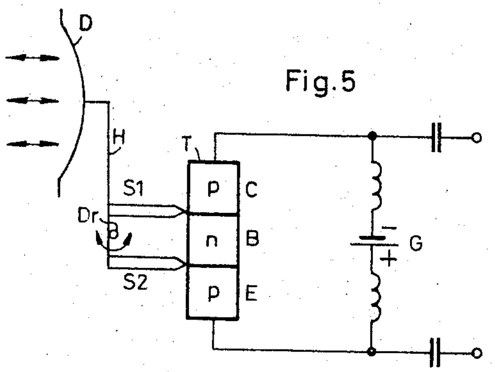
FIG. 5 is a schematic diagram of another embodiment of the transducer device of FIG. 3.

FIG. 5 illustrates an example of an operation in which a pressure magnitude acts in pressure increasing sense upon one pressure point and simultaneously acts in pressure reducing sense upon the other pressure point. The pressure magnitude to be responded to in this case is the sound received by a microphone diaphragm D.

The diaphragm D is directly coupled with a lever H which is pivotally mounted at a pivot point Dr so that the reciprocating vibrations of the diaphragm result in pivotal rotations of the lever H. The rotation of the lever H about its pivot point Dr imparts or exerts mutually opposed movements or pressure forces to the respective pressure points S1 and S2 because said pressure points are affixed to said lever on opposite sides of said pivot point.

A pressure which acts from left to right upon the diaphragm D of FIG. 5 thus imposes pressure upon the first pressure point S1 while it simultaneously applies a pulling force at the pressure point S2. This increases the flow of current through the transistor T. This performance is predicated upon the requirement that both pressure points S1 and S2 are forced against the transistor T at a given biasing pressure. The transistor T is connected in a circuit identical with that of FIG. 3, so that with respect to its performance, reference may be made to the description presented above.

Another way of applying the principle explained with reference to FIG. 5 is to use the transistor having two pressure points as the sensing member for torsional oscillations in a mechanical time-delay member, by applying the torsional oscillations at the end of the time-delay member through respective mechanical coupling means and in mutually opposed phase relation to the respective pressure points. Such time-delay members are employed in time-multiplex communication systems and are known, for example, from Proceedings of the IEE, Part B, Supplement No. 3, April 1956, pages 497–508 (note particularly FIG. 7 on page 501).

A time-delay member of the type described consists essentially of a wire which receives at one end a pulse in the form of a torsional tension which is propagated along the wire in the form of a torsional oscillation and is removed at the other end of the wire through two taps or levers tangentially fastened on the wire. If the levers are fastened to the wire in such a manner that they extend parallel to each other and in the same direction away from the wire, and if said levers are directly connected to two pressure points seated upon or abutting the emitter-base junction and the collector-base junction, respectively, of a transistor, a torsional oscillation of the wire imparts a pressure increase to one pressure point and simultaneously imparts a pressure reduction to the other pressure point, thus controlling the flow of current through the transistor on the principle hereinbefore explained.

Figure 6:
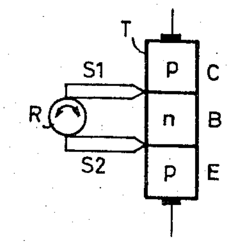
FIG. 6 is a schematic diagram of an embodiment of a device for sensing torsional oscillations of the present invention.

An embodiment of a device for sensing torsional oscillations is schematically shown in FIG. 6. The inner station shows the end of a torsion wire R which can rotate in both directions about its axis, as indicated by a double-headed arrow. During torsional rotation, the wire moves the two pressure points S1 and S2 because said pressure points are tangentially fastened to the wire and are normally placed under a determined pre-pressure. The torsional motion of the wire R thus produces a pressure increase at one junction locality of the transistor T while it simultaneously produces a pressure decrease at the other junction locality of said transistor. As a consequence, the torsional oscillations of the wire R are manifested by alternating current flowing through the transistor.

In devices according to the invention, as exemplified by any of the embodiments described, it is preferable to provide the base region with a protective coating at those localities where it emerges at the surface of the semiconductor body of the transistor. This is most readily applicable in devices of the present invention due to the fact that the base region is not provided with any contact or electrode. It is also of advantage to apply the protective coating to the p-n junctions between the emitter and base and between the base and collector, at those localities where these junctions emerge at the surface. It is particularly advantageous to have the protective coating consist of an oxide, particularly silicon dioxide, or an oxide of the semiconductor material of which the semiconductor body of the transistor is formed.

The emitter region and the base region are preferably produced by diffusion, particularly in accordance with the planar technique. Another way of production is to apply the known simultaneous double diffusion according to which the two regions of mutually opposed conductance type, namely the emitter region and the base region, are produced by diffusing into the semiconductor material two doping substances which produce respectively different conductance types and which also differ from each other with respect to the rate of diffusion. The planar technique has the advantage that the oxide layer, preferably $SiO_2$ employed for masking during the diffusion process, serves also as a protective coating for the p-n junction and the surface of the base region.

When employing the double diffusion process, only a single adjustment is necessary in devices according to the invention because only the one opening in the oxide coating which exposes the p-n junction region, which is the seating locality for the pressure point, need be provided in the oxide coating. In other words, the photo-varnish technique used for masking need be applied only once, whereas the second process heretofore always necessary for affixing the base contacts is obviated in devices according to the invention.

It will be understood that any other known transistor configurations, such as mesa transistors or epitaxial transistors, may be provided with pressure points to be converted into pressure sensitive semiconductor devices according to the invention.

Figure 7:
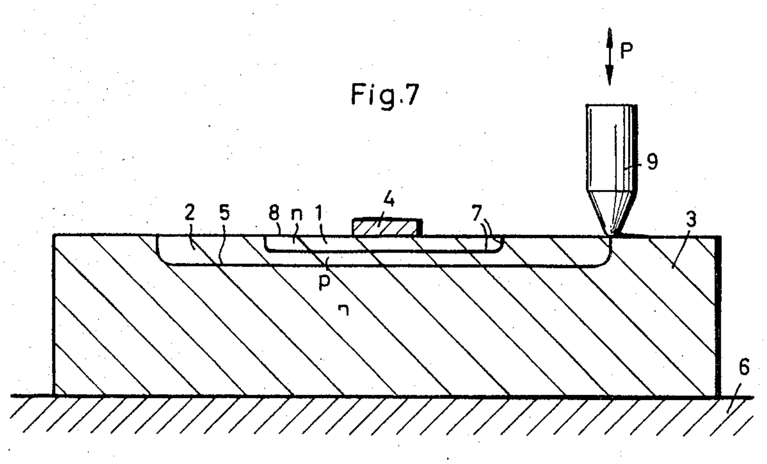
FIG. 7 is a view, partly in section, of the pressure-responsive transistor device of FIG. 1.
Figure 8:
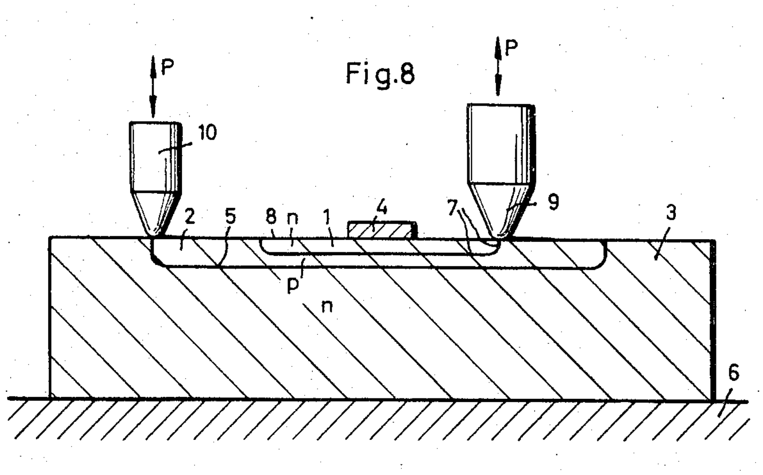
FIG. 8 is a view, partly in section, of the embodiment of FIG. 4.

We have found that transistors of the planar type are particularly well suitable for the purposes of the present invention. Transistors of this type are protected from atmospheric effects by a coating which is so thin that a pressure point can be directly placed upon the coating and the coating sufficiently transfers the pressure variations to the semiconductor body of the transistor without impairment due to the presence of the intermediate protective coating. FIGS. 7 and 8 illustrate two embodiments of such transistors.

In FIG. 7, a single pressure point is located at the collector-base junction and in FIG. 8, two pressure points are located at the collector-base junction and the emitter-base junction, respectively. The semiconductor body material of these transistors consists of silicon, for example, and the thin protective coating, not illustrated in FIGS. 7 and 8, consists of $SiO_2$. When other semiconductor materials, such as germanium, are used, the protective coating preferably also consists of silicon dioxide, which in this case may be produced by vapor-depositing silicon oxide and then further oxidizing it to $SiO_2$. The same reference characters are utilized in FIGS. 7 and 8, and since the embodiments of the transistors of FIGS. 7 and 8 are essentially of the same type, the description of FIG. 7 applies essentially to FIG. 8.

The transistor is of the n-p-n type and comprises an emitter region 1, a base region 2 and a collector region 3. An emitter contact 4 is bonded to the surface of the emitter region 1 and a collector contact 6 is bonded to the surface of the collector region 6. The collector contact 6 simultaneously constitutes a reinforcing carrier plate for the transistor. The n-type emitter region 1 is embedded in the p-type base region 2, and the base region is embedded in the n-type collector region 3 in such a manner that the p-n junctions 7 and 5 are accessible at the top surface 8 of the circular semiconductor disc which forms the body of the transistor.

The embedding of the emitter region as well as of the base region are effected in such a manner that the areas of the p-n junction emerge nearly perpendicularly at the top surface 8 of the semiconductor body. The pressure point 9 is seated on or abuts the top surface 8 at a locality where the p-n junction 5 between the base and the collector emerges, and, if desired, is kept under prepressure as hereinbefore explained. The pressures P exerted by the pressure point 9 on the semiconductor body, which are to be responded to, are thus converted into corresponding transistor currents.

The pressure point 9 need not be placed in direct abutment with the p-n junction 5, but may be placed in abutment with the surface 8 of the semiconductor body in the immediate vicinity of said p-n junction.

The transistor of FIG. 8 is provided with two pressure points 9 and 10. The pressure point 9 is seated at or abuts the surface 8 on or near the p-n junction 7 and the pressure point 10 is seated at or abuts the surface 8 on or near the p-n junction 5.

It will be recognized from the embodiments of FIGS. 7 and 8 that a device of the present invention may also be realized with the aid of a p-n-p transistor. This is also true of the other embodiments. In other words, the invention is equally well applicable to p-n-p and n-p-n transistors.

As is known, transistors may also be used in inverse operation. That is, by reversing the polarity of the voltage normally applied between the emitter and the collector, a reversed flow of current is produced. In such case, the regions normally designated as emitter and collector exchange their respective functions, the emitter becoming the collector and the collector becoming the emitter. In this case, it may be necessary to take into account a reduction in current amplification resulting from the particular geometry of the transistor.

Aside from such normally expected differences, the present invention is applicable when operating transistors in inverse operation. That is, if the normally prescribed polarity of the operating voltage is reversed so that the emitter becomes the collector and the collector becomes the emitter, and if a pressure point is then seated upon the locality originally designated as the emitter-base junction but then constituting the collector-base junction, the aforedescribed effect of current control is achieved in exactly the same manner as described in the foregoing, without requiring the supply of current to the base.

Figure 9:
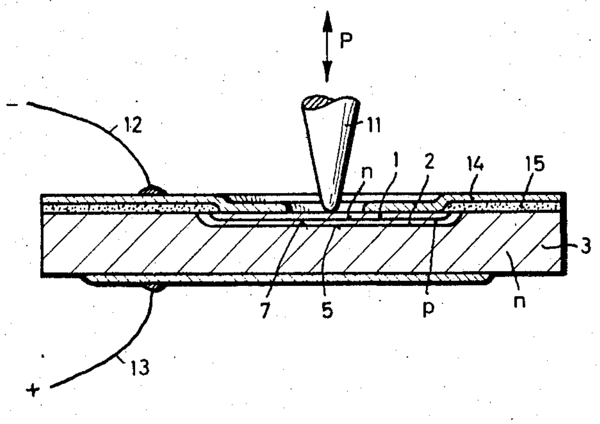
FIG. 9 is a view, partly in section of a modification of the device of FIG. 7.

The device of FIG. 9 is a transistor produced by the planar technique and having a pressure transmitting point 11 seated on the emitter region. The aforementioned method of producing such a transistor with the aid of the protective coating will be described presently.

The original semiconductor body from which the transistor is made consists of a circular, flat disc 3 formed of n-type silicon. Most of the original disc body 3 constitutes a collector region in the finished transistor and consequently has a relatively large thickness in comparison with the base region and the emitter region which are produced as follows. The entire disc 3 is first coated with an oxide layer 15 of silicon dioxide in the conventional manner. The oxide coating 15 is covered with a photo-varnish, that is, a varnish as used for purposes of photo-lithography, also in the manner generally employed.

At those localities where the original silicon body is to be doped in order to be converted to the base region and the emitter region the varnish is removed, thus providing a hole or window in the varnish coating. The hole in the varnish coating is concentrically located in the center of the top surface. The top surface is then subjected to etching. The etchant attacks only the area of the oxide coating which is exposed through the opening in the varnish layer. After completion of the etching operation the varnish is removed and the remaining oxide coating constitutes a mask having an opening where previously the opening in the varnish coating was located.

The semiconductor body is then subjected to doping by diffusion at the top surface, preferably double diffusion as hereinbefore mentioned. Since the dopant can diffuse into the semiconductor material only through the opening in the coating of silicon dioxide, the p-conducting, relatively high-ohmic base region 2 and the n-conducting relatively low-ohmic emitter region 1 are produced in this manner. Consequently, the emitter-base p-n junction 7 and the collector-base p-n junction 5 are formed.

The contacting of the emitter region and the collector region can then be effected in a simple manner, namely by vapor-depositing electrode metal 14 consisting in the present embodiment, for example, of gold-antimony alloy. After deposition of the metal 14 the semiconductor body is heated to cause alloying of the metal with the silicon. The electrode metal 14 serving for contacting the emitter region 1 may also cover the oxide coating 15 because the latter serves as an insulating layer.

Thereafter, the same masking and etching process is used for producing a hole in the center of the metal coating 14, thus exposing the surface of the emitter region 1. The pressure point 11 is then seated upon the exposed surface area of the emitter region 1. The connecting lead 13 makes electrical contact with the collector region 3. During operation of the device the lead 13 is connected to the positive pole of the voltage source. The connecting lead 12 makes electrical contact with the emitter region 1 and is connected to the negative pole of the voltage source. The pressure point 11 preferably consists of sapphire. However, ruby, boron carbide or a hard metal may also be used for this purpose. The pressure point 11 is given a tip whose diameter is preferably less than 20 microns.

The following data, described by way of example only, relates to a pressure-sensitive semiconductor device of the present invention having an n-p-n sequence and a design according to FIG. 9. The distance of the emitter-base junction 7 from the surface upon which the pressure is exerted, is 0.5 micron. The distance of the collector-base junction 5 from the same surface is less than or equal to 1 micron, but greater than the distance of the emitter-base junction 7 from said surface. A current flow passes through the transistor device when applying a voltage of 30 volts between the leads 12 and 13. The pre-pressure to be applied by means of a sapphire point 11 for operating the device is approximately 1 to 5 pounds per square inch.

To those skilled in the art, it will be obvious upon a study of this disclosure that our invention permits of various modifications with respect to design and use and hence can be given embodiments other than particularly illustrated and described herein, without departing from the essential features of the invention and within the scope of the claims annexed hereto.

We claim:

1. A pressure-responsive semiconductor device, comprising a semiconductor body having three sequential regions of alternately opposite conductance types which form a p-n junction between each two of said regions;

current supply means attached only to the outer two regions of said semiconductor body;

pressure means mechanically engaging said semiconductor body at one of one of the p-n junctions and the immediate vicinity thereof and at one of the other of the p-n junctions and the immediate vicinity thereof under a biasing pressure sufficient to render the said semiconductor body conductive; and means for imposing upon said pressure means a pressure variation to be responded to by said device.

2. A pressure-responsive semiconductor device, comprising a semiconductor body having an emitter region, a base region and a collector region, the emitter and base regions forming an emitter-base p-n junction between them and the collector and base regions forming a collector-base p-n junction between them;

current supply means attached only to the emitter and collector regions of said semiconductor body; and pressure means in contact with the semiconductor body at one of the collector-base p-n junction and the immediate vicinity thereof and in contact with the semiconductor body at one of the emitter-base p-n junction and the immediate vicinity thereof for applying pressure to said semiconductor body to vary the current flow through said semiconductor body in accordance with one of the sum and difference of the pressures applied at both p-n junctions.

3. A pressure-responsive semiconductor device, comprising a semiconductor body having an emitter region, a base region and a collector region, the emitter and base regions forming an emitter-base p-n junction between them and the collector and base regions forming a collector-base p-n junction between them;

current supply means attached only to the emitter and collector regions of said semiconductor body; and pressure means in contact with the semiconductor body at one of the collector-base p-n junction and the immediate vicinity thereof and in contact with the semiconductor body at one of the emitter-base p-n junction and the immediate vicinity thereof for applying pressure to said semiconductor body, said pressure means including means for increasing the magnitude of pressure applied to one of said p-n junctions and simultaneously decreasing the magnitude of pressure applied to the other of said p-n junctions.

4. A pressure-responsive semiconductor device, comprising a semiconductor body having an emitter region, a base region and a collector region, the emitter and base regions forming an emitter-base p-n junction between them and the collector and base regions forming a collector-base p-n junction between them;

current supply means attached only to the emitter and collector regions of said semiconductor body; and pressure means in contact with the semiconductor body at one of the collector-base p-n junction and the immediate vicinity thereof and in contact with the semiconductor body at one of the emitter-base p-n junction and the immediate vicinity thereof for applying pressure to said semiconductor body, said pressure means comprising a source of torsional oscillations, a first pressure applying point mechanically coupled to said source of torsional oscillations and in contact with the semiconductor body at one of the collector-base p-n junction and the immediate vicinity thereof in a manner whereby torsional oscillation of said source applies pressure to said semiconductor body in a determined phase relative to the said source, and a second pressure applying point mechanically coupled to said source of torsional oscillations and in contact with the semiconductor body at one of the emitter-base p-n junction and the immediate vicinity thereof in a manner whereby torsional oscillation of said source applies pressure to the said semiconductor body in a phase opposite to said determined phase relative to the said source.

References Cited

UNITED STATES PATENTS

| | | | |
|---|---|---|---|
| 2,530,745 | 11/1950 | Wallace | 179—110 |
| 2,632,062 | 3/1953 | Montgomery | 179—121 |
| 3,199,340 | 8/1965 | Hartenstein | 73—88.5 |
| 3,212,162 | 10/1965 | Moore | 29—25.3 |
| 3,215,568 | 11/1965 | Pfann | 148—33 |
| 3,236,957 | 2/1966 | Karmann | 179—110 |
| 3,278,696 | 10/1966 | Mason | 179—110 |
| 3,312,790 | 4/1967 | Sikorski | 179—110 |

OTHER REFERENCES

"Highly-Sensitive Microphone Uses Transistor as Base," Bell Telephone Laboratories Record, December 1962, pp. 418 and 419.

KATHLEEN H. CLAFFY, *Primary Examiner.*

A. A. McGILL, *Assistant Examiner.*